(12) United States Patent
Shum et al.

(10) Patent No.: US 6,585,902 B1
(45) Date of Patent: Jul. 1, 2003

(54) NON-HOMOGENEOUS LAMINATE MATERIAL FOR SUSPENSION WITH VIBRATION DAMPENING

(75) Inventors: Victor Wing-Chun Shum, San Jose, CA (US); Randall George Simmons, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/259,887

(22) Filed: Feb. 27, 1999

(51) Int. Cl.[7] ................................................ B44C 1/22
(52) U.S. Cl. ............................ 216/13; 216/22; 216/56; 216/99; 216/100; 216/105; 360/137
(58) Field of Search ............................ 216/13, 22, 56, 216/99, 100, 105, 83; 360/137

(56) References Cited

U.S. PATENT DOCUMENTS

| | | | | |
|---|---|---|---|---|
| 4,716,259 A | * | 12/1987 | Tokura et al. ............. 174/68.5 |
| 4,906,803 A | * | 3/1990 | Albrechta et al. ........... 174/254 |
| 4,996,623 A | * | 2/1991 | Erpelding et al. ........... 360/104 |
| 5,598,307 A | * | 1/1997 | Bennin ........................ 360/104 |
| 5,673,484 A | * | 10/1997 | Masaichi et al. ......... 29/896.93 |
| 5,701,218 A | * | 12/1997 | Boutaghou .................. 360/104 |
| 5,712,749 A | * | 1/1998 | Gustafson ................... 360/104 |
| 5,839,193 A | * | 11/1998 | Bennin et al. ............. 29/896.9 |

FOREIGN PATENT DOCUMENTS

| | | | | |
|---|---|---|---|---|
| GB | 2295918 A | * | 12/1996 | ...................... 5/48 |
| WO | WO 97/36290 | * | 10/1997 | ...................... 5/55 |

* cited by examiner

Primary Examiner—Randy Gulakowski
(74) Attorney, Agent, or Firm—Douglas R. Millett; Bracewell & Patterson, L.L.P.

(57) ABSTRACT

An integrated lead suspension is formed from a five layer laminate of stainless steel, polyimide and copper. Prior to lamination, the steel layer has preformed voids which may have various configurations. The voids are provided for intentionally weakening high strain flexure areas in the suspension so that strain energy can be dissipated more effectively.

4 Claims, 1 Drawing Sheet

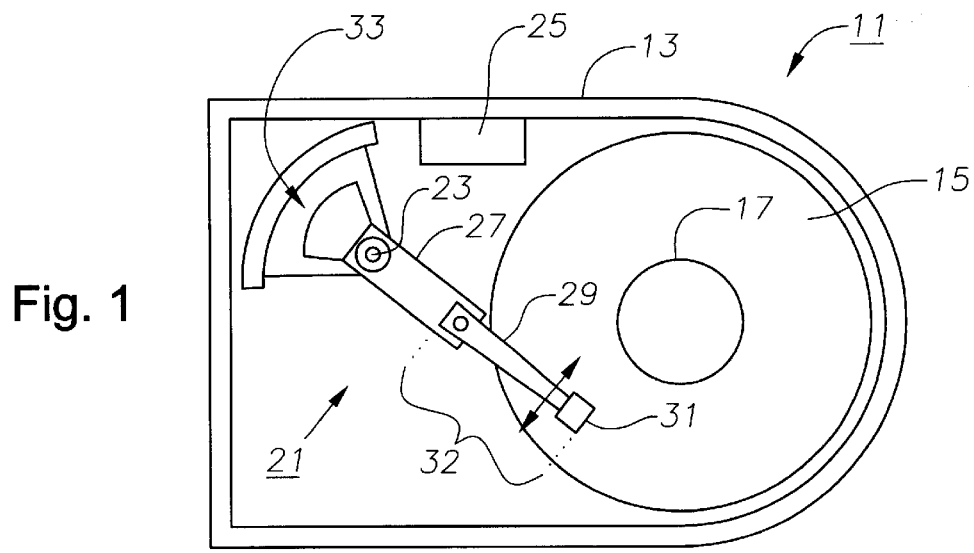
Fig. 1
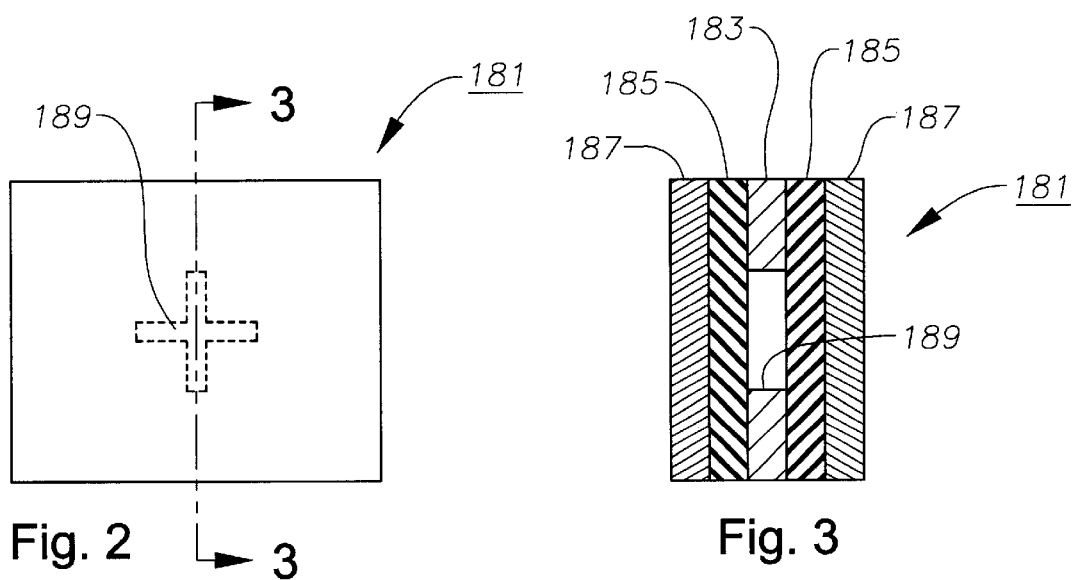
Fig. 2
Fig. 3
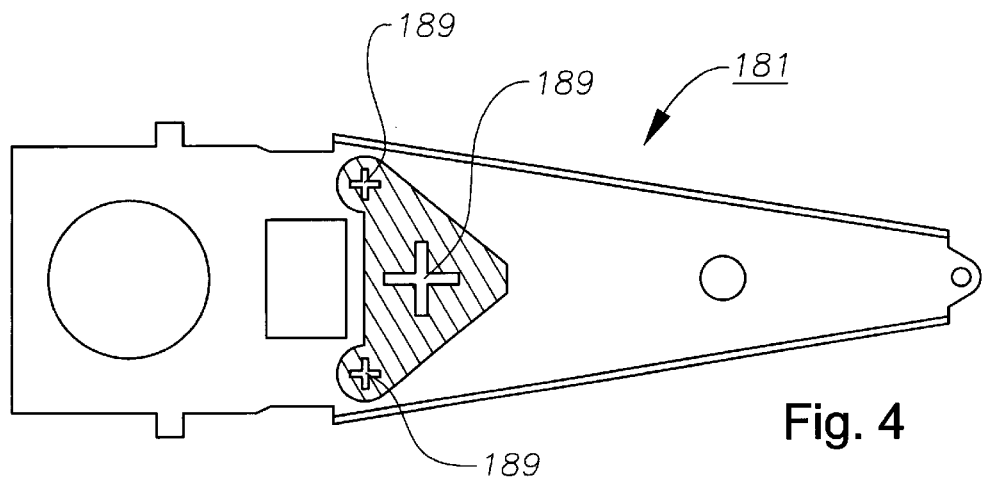
Fig. 4

NON-HOMOGENEOUS LAMINATE MATERIAL FOR SUSPENSION WITH VIBRATION DAMPENING

BACKGROUND OF THE INVENTION

1. Technical Field

This invention relates in general to integrated lead suspensions for hard disk drives and in particular to fabricating and applying non-homogenous laminate materials to an integrated lead suspension with vibration dampening.

2. Background Art

In hard disk drive manufacturing, one type of head gimbal assembly has an integrated lead suspension (ILS). An ILS is typically formed by laminating several layers of material together and then selectively etching the layers to achieve a desired architecture. Alternatively, the layers may be formed by plating them on top of one another. These layers usually comprise at least one of each of the following: a stainless steel substrate or support layer, an insulation layer such as a polyimide, and a conductor layer such as copper. An ILS with a bent lead type design must be etched on both sides to clear the polyimide on the bent lead. This step requires additional process time and adds cost to the suspension.

Uncontrolled vibration in a suspension can limit the performance of a disk drive. Most often, it is desirable to be able to dampen a mode of vibration on a suspension in order to improve the performance. Conventional dampers are available for such purposes, but they are formed from metal and constraint layers in separate processes. Moreover, conventional dampers must be assembled onto the suspension. These additional steps add cost and increase the mass moment of inertia of the suspension. Improved methods for manufacturing integrated lead suspensions are needed to address these issues.

DISCLOSURE OF THE INVENTION

An integrated lead suspension is formed from a five layer laminate of stainless steel, polyimide and copper. Prior to lamination, the steel layer has preformed voids which may have various configurations. The voids are provided for intentionally weakening high strain flexure areas in the suspension so that strain energy can be dissipated more effectively.

BRIEF DESCRIPTION OF THE DRAWINGS

FIG. 1 is a schematic drawing of a hard disk drive.

FIG. 2 is a plan view of a laminate used in a suspension at an initial stage of processing.

FIG. 3 is a sectional end view of the laminate of FIG. 2 taken along the line 3—3 of FIG. 2.

FIG. 4 is a partial sectional plan view of a suspension utilizing the laminate of FIG. 2 after processing and is constructed in accordance with the invention.

BEST MODE FOR CARRYING OUT THE INVENTION

Referring to FIG. 1, a schematic drawing of an information storage system comprising a magnetic hard disk drive 11 is shown. Drive 11 has a base 13 containing a plurality of stacked, parallel magnetic disks 15 (one shown) which are closely spaced apart. Disks 15 are rotated by a motor located therebelow about a central drive hub 17. An actuator 21 is pivotally mounted to base 13 about a pivot assembly 23. A controller 25 is mounted to base 13 for selectively moving actuator 21 as will be described below.

Actuator 21 has a mounting support 27, a pair of parallel, cantilevered load beams or integrated lead suspensions 29 extending from mounting support 27, and a slider 31 having at least one magnetic read/write head secured to each suspension 29 for magnetically reading data from or magnetically writing data to disks 15. The union of a suspension 29 and a slider 31 forms a head gimbal assembly 32. Suspensions 29 have a spring-like quality which biases or maintains them in parallel relationship relative to one another. A motor assembly 33 having a conventional voice coil motor is also mounted to pivot assembly 23 opposite sliders 31. Movement of actuator 21 (indicated by arrows) moves sliders 31 radially across tracks on the disks 15 until the heads on assemblies 32 settle on the target tracks.

Referring to FIGS. 2–4, an integrated lead suspension 181 comprises a laminate of five layers and three materials: a central support layer of stainless steel 183, a dielectric layer of polyimide 185 on each side of steel 183, and a conductive layer of copper 187 on the outer surface of each polyimide 185. In an alternate embodiment (not shown), suspension 181 may comprise a three-layer laminate with a layer of polyimide sandwiched between the steel and copper layers. The laminate of suspension 181 can be formed by selectively etching away different layers, or by selectively plating and building the laminate layer by layer.

Prior to the formation of the laminate, steel 183 is preformed with voids 189 having various configurations. Voids 189 may be formed by prestamping or pre-etching in strategic locations. Voids 189 are located in an area of flexure for suspension 181. After voids 189 are made, the laminate of suspension 181 is formed. Subsequent etching of the other layers of the laminate may also take place. Voids 189 intentionally weaken high strain areas so that strain energy can be dissipated more effectively by using the laminate as a constraint damping layer. In addition, multiple dampers or voids 189 can be placed on the loadbeam or flexure to effectively dampen unwanted vibrations.

The invention has several advantages. The voids prevent the need for double-sided etching to simplify processing and reduce the cost of the suspensions. If the suspension is built using the plating method, the voids are also compatible with the plating process. The voids help create other features which are smaller than would otherwise be available by conventional methods. The voids can also intentionally weaken high strain areas so that strain energy can be dissipated more effectively by using the laminate as a constraint damping layer. In addition, multiple dampers or voids can be placed on the loadbeam or flexure to effectively dampen unwanted vibrations.

While the invention has been shown or described in only some of its forms, it should be apparent to those skilled in the art that it is not so limited, but is susceptible to various changes without departing from the scope of the invention. For example, as set forth in the appended claims, the layers of the integrated lead suspension may comprise a metal support layer, one or more dielectric layers, and one or more conductor layers.

We claim:

1. A method for manufacturing an integrated lead suspension for a hard disk drive, comprising:

(a) providing a metal support layer, at least one dielectric layer, and at least one conductor layer;

(b) forming a void in the support layer at a selected location; then (c) laminating the dielectric layer between the support and conductor layers to form a laminate; and then (d) etching the laminate of step (c) to form a lead suspension, wherein said void intentionally weakens a selected high strain area in the suspension to form a constraint damping layer; and wherein step (c) comprises laminating a second dielectric layer on a side of the support layer opposite said first mentioned dielectric layer, and a second conductor layer on said second dielectric layer to form a five layer laminate with the first and second conductor layers being on a top and a bottom of the five layer laminate.

2. A method for manufacturing an integrated lead suspension for a hard disk drive, comprising:

(a) providing a metal support layer, a pair of dielectric layers, and a pair of conductor layers;

(b) forming a plurality of voids in an area of flexure of the support layer; then (c) laminating one of the dielectric layers on each side of the support layer, and laminating one of the conductor layers on an outer surface of each of the dielectric layers to form a laminate; and then (d) applying an etching substance to the laminate of step (c) and etching at least one of the dielectric layers to form a suspension wherein said voids intentionally weaken high strain areas in the suspension to form constraint damping layers.

3. The method of claim 2 wherein step (b) comprises forming cross-shaped voids in the support layer.

4. The method of claim 2, further comprising the steps of forming the support layer from steel, forming the dielectric layer from a polymer, and forming the conductor layer from copper.

* * * * *